(12) United States Patent
Crosbie et al.

(10) Patent No.: US 8,949,466 B1
(45) Date of Patent: Feb. 3, 2015

(54) SYSTEM AND METHOD FOR ADAPTIVE COMPRESSION

(75) Inventors: John Edward Crosbie, Fremont, CA (US); Anoop Balakrishnan, Fremont, CA (US); Shrikant Acharya, Fremont, CA (US); Shrinath Acharya, Fremont, CA (US)

(73) Assignee: Excelfore Corporation, Fremont, CA (US)

( * ) Notice: Subject to any disclaimer, the term of this patent is extended or adjusted under 35 U.S.C. 154(b) by 20 days.

(21) Appl. No.: 13/369,002

(22) Filed: Feb. 8, 2012

(51) Int. Cl.
*G06F 15/16* (2006.01)

(52) U.S. Cl.
USPC .......................................... 709/247

(58) Field of Classification Search
USPC ................... 709/246–247; 455/436
See application file for complete search history.

(56) References Cited

U.S. PATENT DOCUMENTS

| 7,764,965 | B2 * | 7/2010 | Bartlett | 455/436 |
|---|---|---|---|---|
| 8,046,496 | B1 * | 10/2011 | Nucci et al. | 709/247 |
| 2011/0191577 | A1 * | 8/2011 | Tian et al. | 713/150 |
| 2011/0249843 | A1 * | 10/2011 | Holmberg et al. | 381/316 |
| 2013/0094356 | A1 * | 4/2013 | Keith et al. | 370/229 |

* cited by examiner

*Primary Examiner* — Vivek Srivastava
*Assistant Examiner* — Karina J Garcia-Ching
(74) *Attorney, Agent, or Firm* — Brinks Gilson & Lione

(57) ABSTRACT

Methods and systems are disclosed for adaptive compression is disclosed. The compression is adaptive based on one or more criteria related to the system, including but not limited to: the centralized authority, one or more remote devices, the communication channel, and/or the data communicated. For example, the compression may be adaptive based on one or more criteria related to the remote device, including dynamic and/or static criteria of the remote device. In this way, the adaptive compression may be reduce the amount of data transmitted from the remote device to the centralized authority, thereby conserving bandwidth.

20 Claims, 11 Drawing Sheets

SYSTEM AND METHOD FOR ADAPTIVE COMPRESSION

TECHNICAL FIELD

This application relates generally to adaptive compression. More specifically, this application relates to an adaptive compression scheme for M2M (machine to machine) communications for bandwidth conservation and encryption security.

BACKGROUND

A device that communicates over a communication network uses bandwidth of the communication network and may be charged for the usage of the bandwidth. Over time, as bandwidth usage increases, the cost also increases.

Methods have been applied to combat the bandwidth increase. For example, a method that conserves bandwidth may reduce the cost for usage of the bandwidth. In this way, the data transmission costs are lower for the same bandwidth usage.

One way to conserve bandwidth is using data compression. Data compression is the process of encoding information using fewer bits than the original representation would use. Thus, data compression may be useful because it helps reduce the consumption of expensive resources, such as transmission bandwidth. On the downside, compressed data must be decompressed to be used, and this extra processing may be detrimental to some applications. For instance, a compression scheme may introduce latency and require expensive hardware to be decompressed fast enough to be viewed as it is being decompressed. The design of data compression schemes therefore involves trade-offs among various factors, including the degree of compression, the amount of distortion introduced (if using a lossy compression scheme), and the computational resources required to compress and decompress the data. Therefore, a need exists to reduce bandwidth without the drawbacks of previous data compression schemes.

BRIEF SUMMARY

Methods and systems are disclosed herein for adaptive compression.

In one aspect, a server is disclosed that is configured to select an adaptive compression scheme for one or more remote computing devices. The server comprises a memory and a processor in communication with the memory. The processor is configured to: receive one or more attributes of a remote device; select a compression scheme based on the one or more attributes; and send an indication of the selected compression scheme or the selected compression scheme to the remote device. The one or more attributes of the remote device may comprise static and/or dynamic attributes Examples of static criteria of the remote device include, but are not limited to: type of remote device, such as a type of microprocessor used in the remote device (e.g., an indication of a model of the remote device), an amount of memory used in the remote device, etc. Examples of dynamic criteria of the remote device include, but are not limited to: battery indication (e.g., an amount of battery power remaining on the remote device); and current processing capability (e.g., an amount of processing that the microprocessor can use for adaptive compression). The server may thus use the attributes in order to select the compression scheme (which may be selected from multiple potential compression schemes). The server may then send an indication of the selected compression scheme to the remote device (in the event that the remote device already has the software to perform the selected compression scheme). Alternatively, the server may send the software to perform the selected compression scheme to the remote device.

In another aspect, a method is disclosed for selecting an adaptive compression scheme for one or more remote computing devices. The method includes: receiving one or more attributes of a remote device; selecting a compression scheme based on the one or more attributes; and sending an indication of the selected compression scheme or the selected compression scheme to the remote device.

In still another aspect, a server is disclosed that is configured to select an adaptive compression scheme for one or more remote computing devices. The server comprises a memory and a processor in communication with the memory. The processor is configured to: receive multiple packets from a remote device; select a compression scheme that performs inter-packet compression amongst the multiple packets sent from the remote device; and sends an indication of the selected inter-packet compression scheme or the selected inter-packet compression scheme to the remote device. For example, the multiple packets may include one or more fields. The processor may be configured to select different compression schemes for the different fields in order to perform inter-packet compression amongst the different fields in the multiple packets sent from the remote device. Further, the processor may be configured to select a compression scheme that performs intra-packet compression within a packet sent from the remote device and send an indication of the selected intra-packet compression scheme or the selected intra-packet compression scheme to the remote device. In this way, the processor is configured to select an intra-packet compression scheme and an inter-packet compression scheme. For example, the processor may be configured to select the inter-packet compression scheme for a first field of the multiple packets and configured to select the intra-packet compression scheme for a second field of the packet, with the first field being different from the second field.

In yet another aspect, a method is disclosed for selecting an adaptive compression scheme for one or more remote computing devices. The method includes: receiving multiple packets from a remote device; selecting a compression scheme that performs inter-packet compression amongst the multiple packets sent from the remote device; and sending an indication of the selected inter-packet compression scheme or the selected inter-packet compression scheme to the remote device.

Other features and advantages will become apparent upon review of the following drawings, detailed description and claims. Additionally, other embodiments are disclosed, and each of the embodiments can be used alone or together in combination. The embodiments will now be described with reference to the attached drawings.

BRIEF DESCRIPTION OF THE DRAWINGS

FIG. 8b is a flow chart of the get/set compression type within the adaptive compression process of FIG. 8a.

DETAILED DESCRIPTION

Figure 1A:
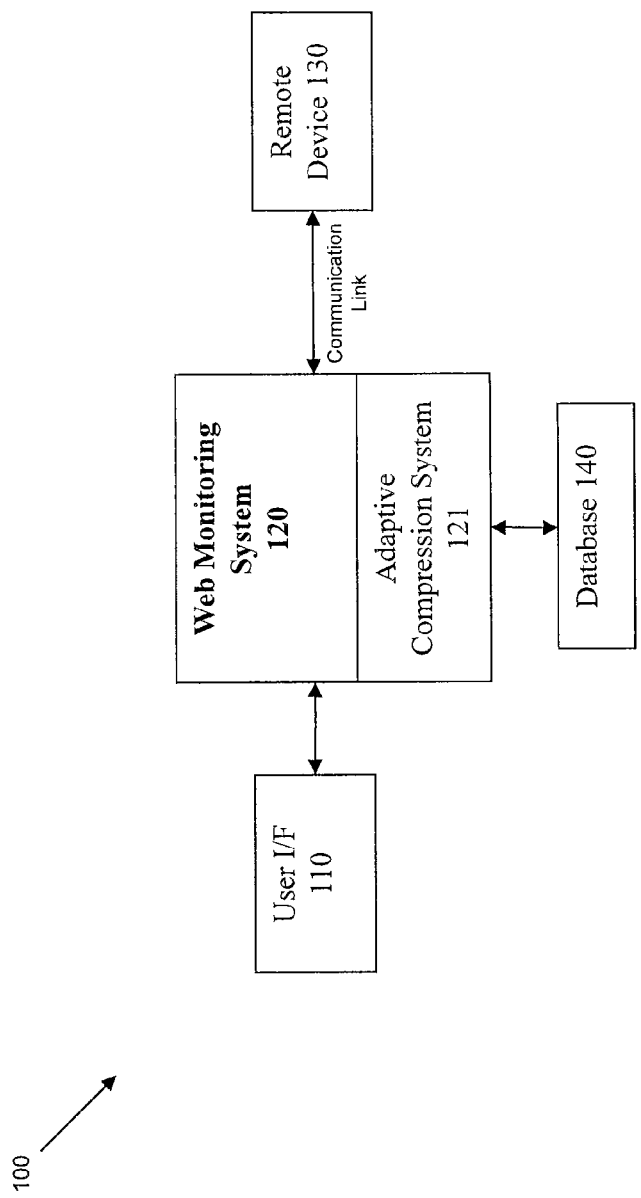
FIG. 1a is a block diagram of an Adaptive Compression Back End Web Monitoring System.

FIG. 1a illustrates a generalized system architecture of Web Monitoring System 120 with an Adaptive Compression System 121. The Web Monitoring System 120 may comprise a Front End, which may communicate with a User Interface (I/F) 110. In this way, User I/F 110 may be a sub-system within Web Monitoring System 120, or may be a separate device that is in network communication with Web Monitoring System 120. The Web Monitoring System 120 may also comprise a Back-End that communicates with one or more Remote Devices 130. FIG. 1a illustrates a single Remote Device 130 for simplicity; however, multiple Remote Devices 130 are contemplated. The Back-End may communicate with the Remote Device 130 through a communication link, such as a LAN, WLAN, GPRS or similar topology.

FIG. 1a further illustrates Adaptive Compression System 121. Adaptive Compression System 121 may comprise a sub-system within Web Monitoring System 120. Alternatively, Adaptive Compression System 121 may work with, and be separate from, Web Monitoring System 120.

Remote Device 130 may receive commands from Web Monitoring System 120. In response to receiving one or more commands, the Remote Device 130 may return data and status back to Web Monitoring System 120. Web Monitoring System 120 may also maintain connectivity to Database 140 for storing the information received from or about Remote Device 130.

Remote Device 130 may be a mobile device or may be stationary. Further, Remote Device 130 may be remote from Web Monitoring System 120 (which acts as a centralized authority) in the physical sense (e.g., at a remote physical location) and/or in the communication sense (e.g., communications between Remote Device 130 and Web Monitoring System 120 use a particular communication channel).

Figure 1B:
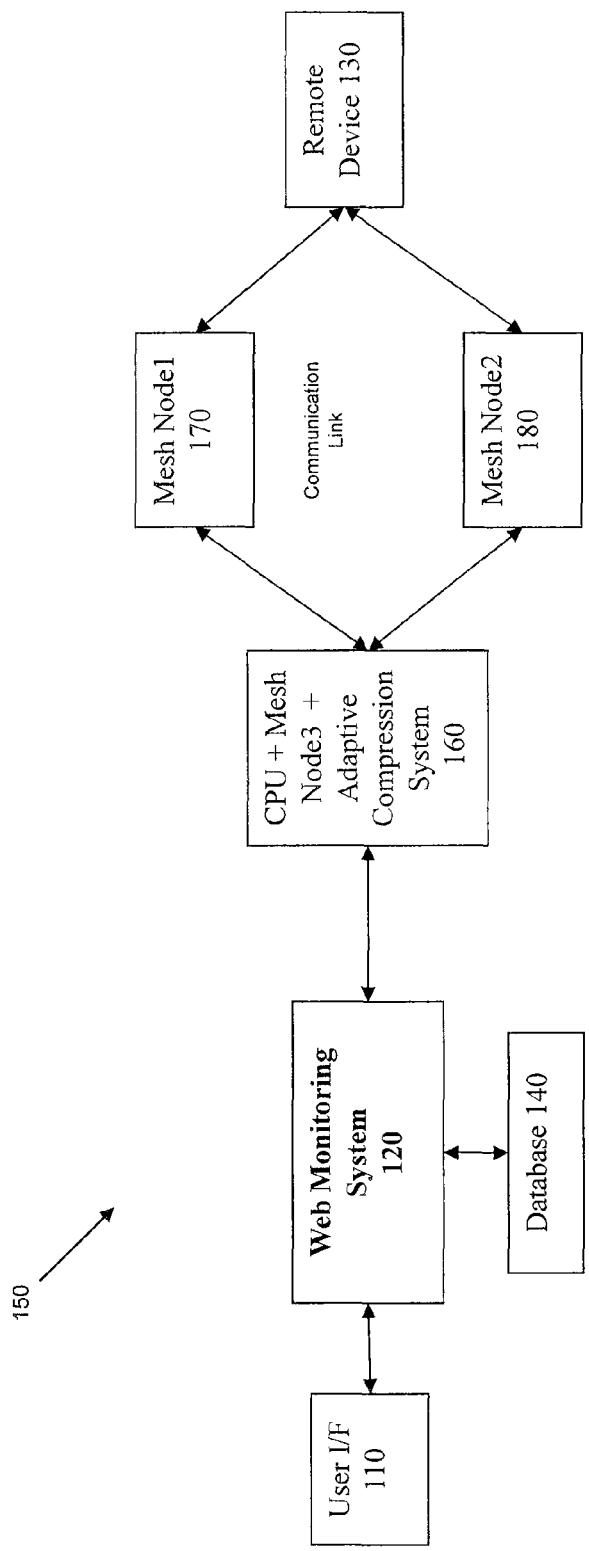
FIG. 1b is a block diagram of an Adaptive Compression Back End in a mesh network which is part of a Web Monitoring System.

FIG. 1a merely discloses one example of a centralized system architecture 100 (with Web Monitoring System 120 acting as a centralized authority) that may be used in combination with adaptive compression. Another embodiment of a monitoring system is a mesh network as shown in FIG. 1b, illustrating mesh node 1 (170) and mesh node 2 (180). In this system, the adaptive compression system is housed in one of the mesh node 3 (160) instead inside the 120. The block 160 has enough performance to do the analysis of the compression schemes for the data received from 130 and notify the server 120. Server 120 can then update 130 on any new compression method to be employed.

When communicating with remote systems, such as Remote Device 130, one or more factors are considered. One factor is conservation of bandwidth. As discussed in more detail below, the adaptive compression may be used to conserve bandwidth. Another factor is security of communications between the Remote Device 130 and the Web Monitoring System 120 Back-End. As discussed in more detail below, encryption may be applied on the packet after the data compression is completed for increased security. Though two factors are listed, both factors need not be satisfied. More specifically, the system may use the adaptive compression without the encryption. Alternatively, the adaptive compression may be used in combination with encryption.

In one aspect, the compression is adaptive based on one or more criteria related to the system, including but not limited to: the centralized authority, one or more remote devices, the communication channel, and/or the data communicated. For example, the compression may be adaptive based on one or more criteria related to the remote device. As discussed in more detail below, the remote device may have dynamic and/or static criteria. The adaptive compression may be based on one or more of the dynamic and/or static criteria. Examples of static criteria of the remote device include, but are not limited to: type of remote device, such as a type of microprocessor used in the remote device (e.g., an indication of a model of the remote device), an amount of memory used in the remote device, etc. Examples of dynamic criteria of the remote device include, but are not limited to: battery indication (e.g., an amount of battery power remaining on the remote device); and current processing capability (e.g., an amount of processing that the microprocessor can use for adaptive compression). Thus, the compression schemes selected may account for the capability of the Remote Device 130 (such as a lower-performance Remote Device 130) while still providing adequate compression of the data.

As another example, the compression may be adaptive based on one or more criteria related to the communication channel. Criteria for the communication include, but are not limited to: bandwidth; and cost of data transmission. For example, the cost of data transmission may be constant, or may vary (such as depending on the time of day). The compression scheme selected may account for the cost of the data transmission, such as using certain compression schemes to reduce the amount of data transmitted when the cost of data transmission is greater than a predetermined amount. In this way, the communication channel may have dynamic and/or static criteria.

As still another example, the compression may be based on the data communicated. Compression may tend to decrease the amount of data transmitted if the data is correlated. Conversely, compression may not decrease (and may actually increase) the amount of data transmitted if the data is not correlated. Thus, the compression scheme(s) selected are based on the profile of the data transmitted, such as whether the data is correlated (e.g., whether the data in a particular field in multiple packets is correlated or whether the data in a particular field in a single packet is correlated). Given the correlation of data, the compression scheme may be inter-packet and/or intra-packet. In particular, compression may be intra-packet with one or more compression schemes selected for within the packet. For example, a first compression scheme may be selected for the payload of the packet, and a second compression scheme (which is different from the first compression scheme) may be selected for another field (or other fields) of the packet.

Moreover, the compression may be inter-packet or amongst multiple packets. Inter-packet compression comprises an interleaved compression method that is packet-to-packet. As discussed above, the data in a particular field (or particular fields) may be correlated amongst multiple packets. For example, one field in a packet is the "date" field. Since the "date" field does not change frequently (once every day), the data in the date field from one packet to the next is highly correlated. So that, for the particular date field, a particular compression scheme may be used amongst the different packets. As a basic example, a "0" value may be used to indicate that there is no change in the value from what was previously sent. As another example, one field in the packet is the "velocity" field. Again, data in the velocity field does not change significantly from one packet to the next. In this way, the data in the velocity fields in the different packets are generally correlated to one another.

As still another example, different inter-packet compression schemes may be selected for different fields. As discussed above, the data in the "date" field in a first packet is correlated with the data in the "date" field in a second packet. So that, a compression scheme may be selected to compress the data in the "date" field for different packets. Likewise, the data in the "velocity" field in a first packet is correlated with the data in the "velocity" field in a second packet. However, even though the "date" field data and the "velocity" field data is correlated for the different packets, the data in the "date" field and the data in the "velocity" field may not be correlated with one another. So that, the compression schemes selected for different fields (such as for the "date" field and the "velocity" field) in the packet may be different.

Alternatively, similar or the same inter-packet compression schemes may be selected for different fields. In the event that two fields in the packet are correlated, the same or similar compression schemes may be used. One example is "velocity" field and "latitude/longitude" field. In the example of a mobile Remote Device 130, the data in the "latitude/longitude" field for the vehicle in each packet will not change significantly. If the packet is transmitted periodically (such as every 10 seconds), much of the data in the "latitude/longitude" field is repetitive in nature. So that, the data in the "latitude/longitude" field may be compressed (such as only sending the difference in the data sent in the previous packet for the "latitude/longitude". Further, the data in the "velocity" field is at least loosely correlated to the data in the "latitude/longitude" field. Thus, the compression schemes selected for the data in the "velocity" field and for the data in the "latitude/longitude" field may be selected interdependently. For example, the compression schemes for the data in the "velocity" field and for the data in the "latitude/longitude" field may be the same or similar to one another.

Further, the compression for a particular packet may be inter-packet (e.g., dependent on values in another packet) and intra-packet. In particular, different portions of the packet, such as different fields in the packet, may have different correlations and thus necessitate different compression schemes. Data in one field of a first packet may be correlated with the data in the same field of a second packet, supporting inter-packet compression. Likewise, data in another field of the first packet may be correlated with itself (and not packet-to-packet), supporting intra-packet compression of another field. In this way, the compression scheme for one or more fields in the packet may be inter-packet (such as fields for "velocity", "latitude/longitude", "date", etc.) and for another one or more fields may be intra-packet (such as the data payload of the packet).

Figure 2:
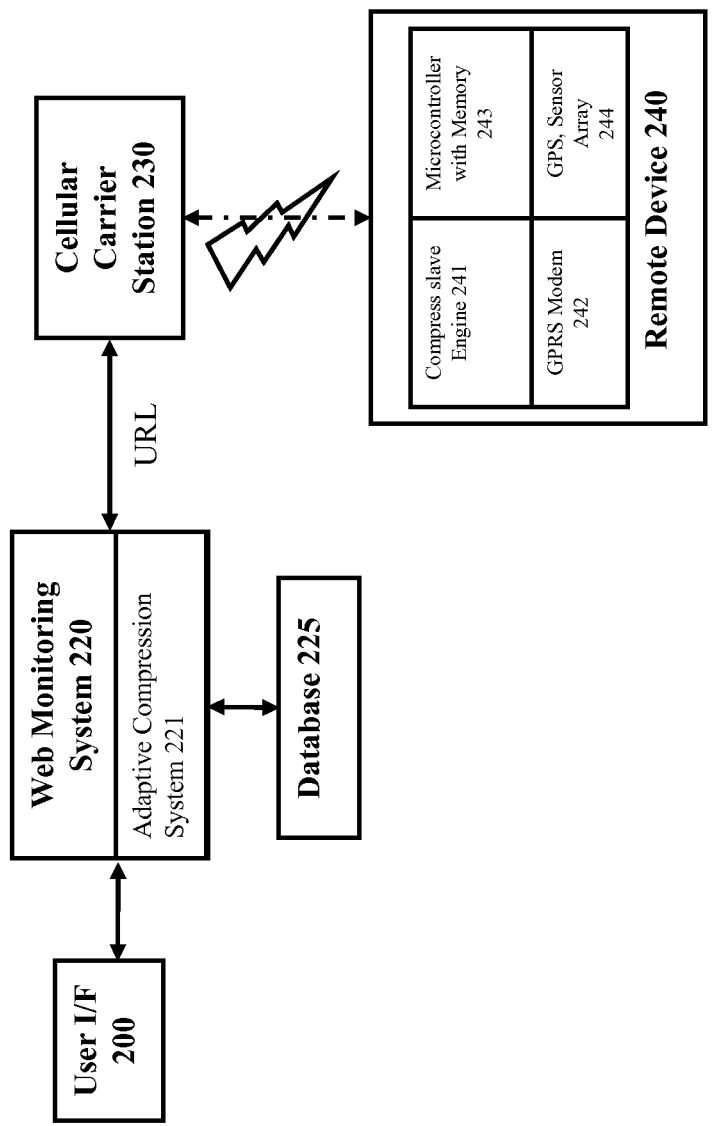
FIG. 2 is a block diagram of a Remote Device that uses a cellular communication link.

FIG. 2 illustrates a specific example of a Remote Device 240 that uses a cellular communication link. FIG. 2 is merely for illustration purposes as to a specific type of communication medium. The present concepts may be used in other applications and devices using different communication media. FIG. 2 illustrates User Interface 200, Web Monitoring System 220, Adaptive Compression System 221, and Database 225, which is communication with Adaptive Compression System 221. As discussed above, Adaptive Compression System 221 may be a subsystem within Web Monitoring System 220. Alternatively, Adaptive Compression System 221 may communicate with, and be separate from, Web Monitoring System 220.

Web Monitoring System 220 communicates through a URL Link on a connected line to Cellular Carrier Station 230. Cellular Carrier Station 230 communicates wirelessly with Remote Device 240. Remote Device 240 comprises various subsystems including: GPRS Modem 242 for connecting to Cellular Carrier Station 230; a compress slave engine 241 to compress data; a processor/memory (such a microcontroller and memory 243), and an I/O block (such as GPS and one or more other sensors 244). Remote Device 240 includes certain sub-components for illustration purposes only. Other functionality, instead of or in addition to the functionality illustrated in FIG. 2, may be present in Remote Device 240.

Typically, M2M (Machine to Machine) devices communicate over a specific URL to a web back end. The data packets in general are neither encrypted nor compressed. The data packet can be small (e.g., 256 bytes in length). Each modem has a unique identification (such as an EMEA ID). The web-back end may match the EMEA Code to validate the device. However, this check alone is insufficient to guarantee the bona fides of a remote device. A rogue device could perhaps emulate the EMEA code and attempt to communicate with the back end server, thereby causing problems.

While a single modem link communicating 256 bytes per transmission may not amount to much, it is the agglomeration data across a host of remote devices taken as a group that begins to make a significant impact on the bandwidth utilization. Hence, conserving bandwidth may impact the cost that is paid to a carrier.

Classic compression schemes provide a static data compression of the bits in transmitted data packets. Since data typically has several parameters that are uncorrelated, a standard compression scheme of the data packet may not effective. In one embodiment, an interleaved compression system and method is used. The interleave compression system and method compresses data inter-packet or from packet-to-packet.

As discussed above, the compression scheme selected may be based on one or more characteristics of the remote device. So that, an adaptive compression scheme may be used that is designed for a low-performance remote device. Since a web back-end typically has far more computation capacity then a remote device, the compression scheme deployed for transmission is initiated by the back-end web server. Alternatively, the compression scheme deployed for transmission is initiated by the remote device.

The back-end web server may provide the adaptivity to the compression function, which may routinely examine the packets and their characteristics and then prescribe an algorithm or methodology that will suit one or more aspects of the data (such as the particular data set transmitted), the communication environment, and/or the remote device (such as the computational power of the remote device).

To simplify the architecture, a predetermined set of compression schemes (e.g., compression types) may be installed in a remote device a priori. This way the server can ascertain the compression options without having to transmit new compression software for loading onto the remote device. Alternatively, the server may transmit the compression algorithms to the remote device. For example, if the data set is performing non-optimally using the pre-installed compression schemes, the server, while analyzing the incoming packets from the remote device, may select and transmit a new compression algorithm to the remote device. Upon receipt of the new compression algorithm, the remote device may subsequently start using the new compression algorithm to compress its data set. The change in algorithm may be reflected in the proper code in the data packet header.

The Remote Device 130 may communicate using one of several data packet organizations. One type of data packet organization is discussed in more detail below. It contains a set of packet identifiers which identify the packet, and which contains the Device ID, Packet header, length of the packet etc. These initial descriptors are transmitted as absolute values and need not be compressed.

The next set of parameters are the positional variables, e.g. Time, Date, Location, and actual data packets which contain sensor information, e.g. temperature profile of cells that make up an electric vehicle battery management system.

The position variables that usually identify the origin of the packets as well as the device are uncorrelated. For example, date is not correlated with time and both position data and time data are not correlated with the location data, and so on. There are, however, different types of correlation.

When several packets are received, one can find correlation between the packets of a specific position variable, such as correlation between the date fields of the received packets. For example, the date variable changes once a day. This type of correlation that exists between packets is called inter-packet correlation in the data set.

The data block within a received packet on the other hand can contain data which has a correlation between elements in the data block itself. For example, if a data block were to carry a temperature profile of the various cell elements that comprise an electric car battery, one can intuitively ascertain that there will be a good correlation amongst the temperature values between cells. Thus, another type of correlation that exists in a data block within a packet is intra-packet correlation.

The server knows the packet organization of a remote device as it is a formatted data so that the server needs to have a priori knowledge of the data organization in a data packet; otherwise, the server will be not be able to put the variables in their correct location in the database.

There are several types of compression algorithms subject to the adaptive compression scheme. The following examples are provided merely for illustrative purposes. Other compression schemes are contemplated. One type of compression scheme is Differential Pulse-Code Modulation (DPCM) Coding of Correlated Variables. DPCM is a signal encoder that uses the baseline of PCM but adds some functionalities based on the prediction of the samples of the signal. The input can be an analog signal or a digital signal. DPCM transmits the difference between the values of variables instead of the whole value of the variable. If there is sufficient correlation between elements in a data set e.g. pixel values in an image, then transmitting the differences can reduce the amount bits to encode them. For example, if the successive pixel values in an image are 43 44 45 40 39, the first pixel value can be transmitted as an absolute value and the subsequent pixels values can be transmitted as the difference for the subsequent ones. In this example, the values transmitted would be 43 +1, +2, +3, −3, −4 and so on.

Therefore, if fixed bit assignment of 8 bits is provided to code the signed binary value of positive 43, the other difference values can be accommodated in a maximum of 3 bits including the sign bit. The bit assignment could be 8, 3, 3, 3, 3, 3, giving a total of 23 bits instead of coding them with absolute values of 8, 8, 8, 8, 8, 8 which is 48 bits in all. Therefore performing DPCM can result in a data compression. However, if the differences are huge because the data is not correlated, then performing DPCM may not result in a data compression.

Another type of compression scheme is Huffman Coding. Huffman coding is an entropy encoding algorithm used for lossless data compression. Huffman codes are code bits assignment to values of variables based on their order of occurrence or probabilities. The highest occurrence or probability is assigned the lowest number of bits and lowest probability number is accorded the highest number of bits. For example, if there is a variable distribution of values (7 bit representation) that range from 0-127 with zero having the highest probability and 127 having the lowest, then the Huffman code value of zero could be assigned in two bits, while 127 could be assigned in 12 bits.

If one were to code a series of values such as 0 0 0 0 127, the bit assignment for the numbers could are 3, 3, 3, 3, 8, respectively, giving a total of 18 bits, which is much smaller than a 7 bit representation for each (which would have taken 35 bits). This type of coding results in a 2:1 compression.

Huffman codes also have a property called self-terminating, which makes it easy to implement in a simple state machine. Self-terminating is a property whereby the decoder when it reaches the end of tree knows that it has decoded the variable. Therefore, the next bit position will start the decoding of the next variable. This is very suitable for low end implementation, such as in a remote device, which may have a limited microcontroller (such as an 8/16 bit microcontroller and is running on batteries). For example, if the highest occurrence happens for a value, then it is assigned a binary value '01' as a code. Even though a value of 4 would take an 8 bit representation as 00000100, the fact that it can be represented with a two digit code value of "01" gives it the compression.

Still another type of encoding methodology is Arithmetic encoding. Arithmetic encoding is a form of variable-length entropy encoding used in lossless data compression. The Arithmetic encoder automatically builds the profile of the code table as it encodes the variables in a stream. Therefore, the Arithmetic coder builds its code tables dynamically. This is unlike the Huffman table, which uses statically built code tables. Huffman codes on the other hand are created with pre-determined possibilities. Therefore, it can be less optimized to a data set. The basic notion of the Arithmetic code is that it will provide over time a better optimized encoding strategy as it adapts to the bitstream.

Several Arithmetic coding variants exist, any of which may be used as an option in the coding type. In the examples given, either the Huffman Code or the Arithmetic codes may be applied to the differential series once DPCM is performed on the positional variables.

When differences continue to be transmitted across several packets, overtime errors can accumulate. In order to reduce or zero the errors out, sync packets are transmitted. The synchronization packets are packets that contain absolute values and are sent periodically to compensate for events such as transmission errors, break in transmission, new connection, etc.

A synchronization packet refreshes all the variables in their respective fields in the data packet, to their exact magnitude value as if it is the initial transmission (first data packet sent by the device from reset). This allows the decoder to reset the values to actual magnitudes and bring down any accumulated errors in computation to zero. The sync packet is redundant if there are no transmission errors and there is no break in transmission.

Figure 3:
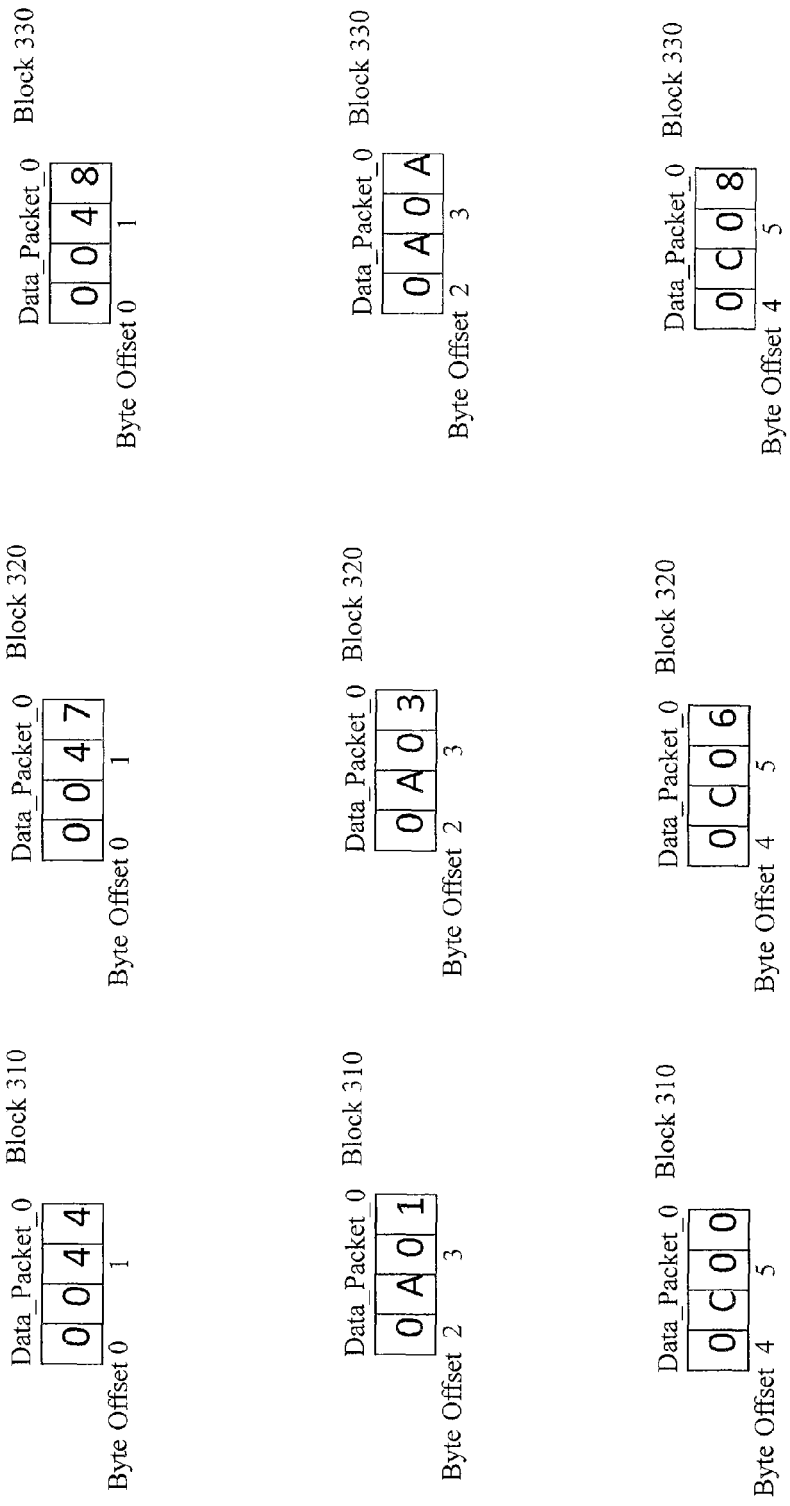
FIG. 3 are examples of data packets transmitted by the Remote Device.

FIG. 3 illustrates three data blocks (Block 310, Block 320 and Block 330). One may assume that each dual byte represents a variable starting at offset zero for each of the blocks

310, 320 and 330, respectively. These variables at offsets 0, 2, and 4 have no correlation to each other.

For explanation purposes, parameters are assigned to each byte offset including: Byte offset 0 provides the Date; Byte offset 2 provides the Time; and Byte offset 4 provides GPS Latitude, and so on As illustrated above, each byte offset refers to a unique parameter that does not correlate to the other parameters in the data packet. Applying compression to a set of uncorrelated data can have the possibility to increase the size of the data packet. Therefore, compressing a data packet with uncorrelated data elements is not necessarily the most efficient way to encode packets.

However, as explained in more detail below, if one takes into account the spatial location of parameter at a specific byte offset in one packet and how it relates to a value of the same parameter located at the same byte offset position in the subsequent data packet, one can find correlation between them as they reflect the behavior of the same variable over time. Moreover, if one does not expect a dramatic change in the behavior from packet to packet, this means that the two values representing a given parameter at specific byte offset position in separate data packet are correlated. Compressing correlated data sets can be made efficient.

For instance, byte offset 0 is a "date" value; it can only correlate with the "date" value which is available at the same byte position in the succeeding packet. Similarly, byte offset position 2 carries the time value, and is only correlated with the byte offset 2 in the next packet which also carries the time value. Likewise, byte offset 4 carries GPS latitude location, which will correlate only with the specific byte offset 4 in the succeeding packet carrying the GPS latitude and so on.

In this way, taking into account the spatial correlation of parameters may increase the efficiency of the data compression. However, prior to applying compression, one may also seek to take the correlation out of the parameters through a technique known as DPCM (Differential Pulse Code Modulation), as explained below.

The DPCM technique may be used to transmit difference, whereby a coefficient's relation to its own value is used from one transmitted packet to the next in order to reduce the magnitude of subsequent value of that parametric data transmitted (inter-packet correlation). This allows the difference value to be represented in less number of bits and hence achieving compression.

FIG. 3 illustrates a series of data packets. For instance, a value of 44 is assigned to the parameter at byte offset 0 in Data_Packet_0, called parameter "A". Similarly, one may assume that the parameter 'A" in Data_Packet_1 has the value 47 and in the Data_Packet_2 is 48. By representing the difference, one can create a series which can either look like Series 1 or Series 2.

Series 1: Instead of transmitting values e.g. 44 in packet 0, 47 in packet 1 and 48 in packet 2, giving a series like 44, 47, 48 . . . , one could have a series like 44, +3, +4 . . . where the first value is the real magnitude the next value represents the exact magnitude from the first variable (value 44).

Series 2: Another method to transmitting differences is to send differences between variable values in the same packet. Therefore, the Standard series, if only magnitudes are transmitted, would be represented by the series 44, 47, 48 . . . would reflect as 44, +3, +1. This series reflects the differential value from the last known transmitted value.

Applying this concept to the data packet assignment provided in FIG. 3, consider the byte position 0 as carrying the date in Packet 310. The date will not change for the day as it is the same for 24 hours, so if the first packet is positioned to carry the actual value of the date, subsequent values at offset byte 0 can simply carry a value of zero as the date does not change for 24 hours. However, in real practice, the value zero is carried only for specific number of packets. This is because transmission of packets can face interference and have transmission errors. Every specified number of packets (such as every 16 packets), the remote device will send actual magnitude of the data. As discussed above, such packets are sync packets. A sync packet is a packet which refreshes all the value to their actual magnitude instead of the difference, thereby preventing error accumulation in bit stream.

So, if the current value of date is used to reflect Jul. 31, 2011, every subsequently value would be zero. July 31st can be calculated as day 211 from start of the year, so a value of 211 will be there in every packet. Instead, one could create a series e.g. 211, 0, 0, 0, 0, 0 . . . . A similar process can be detailed for other variables such as time, latitude, longitude etc.

As explained above, once one, some, or all of the spatial variables are encoded at specific byte location, one may be able to generate a differential series (DPCM) at each variable position within the packet. Each byte position DPCM series will create its own statistics. To obtain a better compression based on a statistics of a variable, a Huffman code can be devised or even fixed code size table can be constructed. Fixed code tables assign code values that are constrained to specific number of bits for each value for a variable.

For the purposes of explanation, the example of Huffman codes is cited. Each variable statistics can create its own Huffman table. So, for optimal compression, one can use one Huffman table for each variable because the DPCM value series they create will be different.

In FIG. 3, there can be, for example, three variables for time, data and GPS Latitude at byte offsets 0, 2, and 4 respectively. Each byte position will be creating its own unique DPCM series, with the statistics generated at byte position 0 being different than byte position 2, which in turn is different from the statistics for byte offset 4.

In the example given, Huffman table 1 may code "time", Huffman table 2 may code "date" and Huffman table 3 may code the "latitude". The server may know what table is being used for each variable. If there is not enough space to store separate Huffman tables, each variable's statistics could be combined to create a single fixed Huffman table. Although this will not be as efficient, it can be implemented in a limited memory environment.

As DPCM encoded variables brings the differences, then each of the positional variables for succeeding packets will look like the following:

Date: the first packet will look like 080311 (in the example of a date of Aug. 3, 2011) and succeeding packets will be 0, 0, 0, . . . until the 24 hour period is complete (or until a sync packet is transmitted);

Time: the first packet could look like 080000 (for 8 AM in the morning), it will have a ticker every 1 minute or by the predetermined offset. Here one assumes the offset to be one. With "one" minute as the offset, one has a difference value of 1, 1, 1, 1, 1, 1, 1, for each subsequent packets.

As one can infer from above, the magnitude values such as "080311" or "080000" are not common occurrences and can be coded as absolute values as the corresponding Huffman code representation in the number of bits could exceed the magnitude representation itself. So, the statistics of all variable occurrences may be compiled over time and organized in the descending order of probabilities. Huffman code determination then occurs by providing the shortest code for the high probability occurrences. Huffman codes are self-terminating and therefore can be easily decoded in a state machine and lookup table.

A server may designate a series of compression types as a static loading option during installation or a dynamic loading option during initialization of the device. Static loading are pre-programmed compression types in the device when installed. The server may request the compression types installed in a device (static loading) using a request command.

During a dynamic loading of compression types, the server has the ability to indicate to the remote device (slave) as to which compression method has to be adopted for future transmissions. Dynamic loading of the compression types can be performed in two ways. First is to seek the compression attributes and device attributes of the remote device. Once the server has determined that a new compression scheme is to be deployed, the server can then execute the compression command sequence for the remote device in the following suggested sequence illustrated in the flow chart 400 of FIG. 4.

At block 410, the server can request the compression attributes. At block 420, in response to sending the request for the compression attributes, the server can receive an acknowledgement from the remote device with remote device's compression profile.

Figure 5:
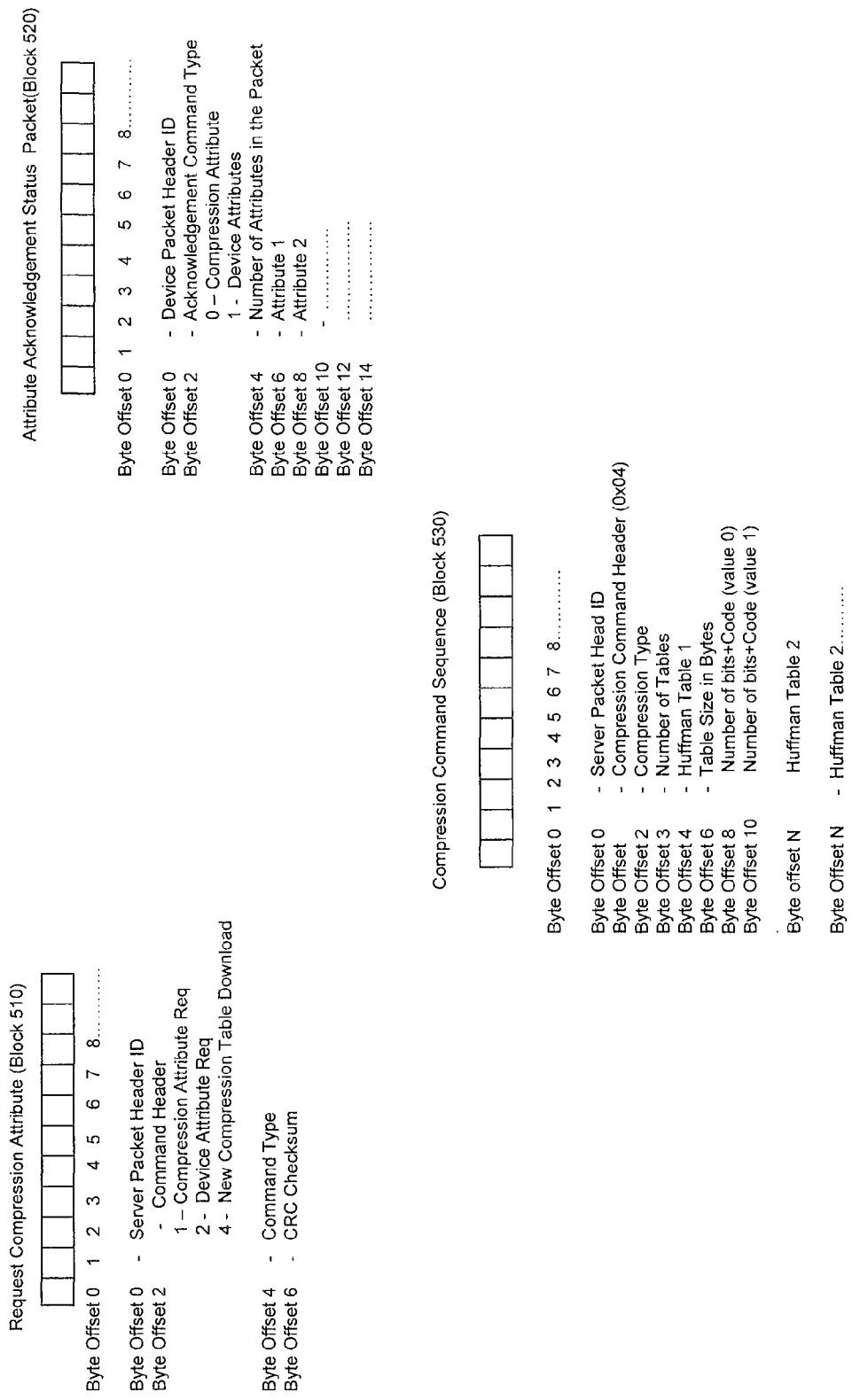
FIG. 5 shows examples of device command/ack sequence.

At 430, the server can request from the remote device its device attributes (an illustration of the request is shown in Block 510 of FIG. 5). At 440, in response to sending the request for the device attributes, the server can receive an acknowledgement from the remote device with remote device's device attributes (an illustration of the response is shown in Block 520 of FIG. 5). Based on the information received, the server may determine a compression scheme. And, at 450, the server may send the determined compression scheme (an illustration of the determined compression scheme is shown in Block 530 of FIG. 5).

530 in FIG. 5 illustrates an example of an outline of a compression command structure. Assuming that the data compression deployed as indicated in the offset 2 is value "4", this means that the compression type "4" is the current compression method employed. If the server decides that a new compression scheme should be adopted, the server can assign a value of "8" to the compression type. In response to receiving a command with a new compression type, the remote device can then start using the compression type "8" for subsequent packets and the acknowledgement of having executed the command is reflected in the status parameter value at a predetermined byte offset. For example, "offset 95" can begin carrying the value "8" to indicate the compression type currently employed by the remote device.

Various attributes may be used by the server to determine the type of compression scheme, including device attributes, compression attributes, fixed attributes, and/or dynamic attributes. Any combination of the listed attributes, including one, some, or all of the listed attributes may be used in determining the type of compression scheme. With regard to device attributes, one or more attributes may define the capabilities of the remote device. The attributes may be requested by the server (such as at block 430 in FIG. 4).

With regard to compression attributes, several compression algorithms can be available in a given device which is tuned to specific data types. The following are merely some examples of representative compression algorithm types: Attribute 0 (raw packet transmission mode); Attribute 1 (can perform DPCM on each variable for each position separately and maintain a separate buckets for each variable); Attribute 2 (can perform DPCM on each position variable and then perform for that position variable a huffman coding from a fixed Huffman Table. The device is capable of substituting a different table if downloaded); Attribute 3 (can perform functions of Attribute 1 and can also substitute Arithmetic coding for Huffman coding on each position variable); and Attribute 4 (JPEG Encoded stream, especially for Image Capture from still Camera). These attributes represent merely a small set which can be expanded to represent newer compression types suited to specific vertical applications.

Other Attributes are Contemplated

Fixed attributes, by definition, do not change over time. The need to represent different device attributes is to assign a certain performance threshold so that the server can decide what computations are possible with the remote device. The following are examples of using fixed attributes for a remote device.

Grade I device: One computational marker is to set the machine type is the remote device. The Grade I types of devices can have 8/16 bit microcontroller with a limited program memory. Grade II device can have a 32 bit micro and more programmability. Either of the Grade I or Grade II devices can be battery operated in which case the performance is degraded to prolong battery life. Battery operated devices are operational when woken up and stay live for short bursts and then re-enter power saving mode.

Data Profile is another example of a fixed attribute. The data profile provides the server with specific information of the nature of data that is coming over the pipe. If this attribute is not present, the server can always empirically determine the level of correlation in the data within the packet and assign a compression scheme for the data in the packet.

Dynamic attributes, by definition, may change over time. These attributes can pertain to the transmission medium and can also pertain to remote device characteristics, such as battery level, processor availability etc. The following are merely examples of the dynamic attributes that can enable the server to determine the level of complexity of the adaptive compression scheme to be employed.

Channel Bandwidth: this attribute refers to the type of transmitting device or modem deployed by the remote device. Modems can be 2G (2nd Generation), 3G (3rd Generation), Edge or LTE (Long Term Evolution) and so on. Each generational difference in modem technology allows a specific peak level of bandwidth transmission. This is a key parameter for determining compression scheme.

Battery Level: a lot of the remote devices are powered by batteries. Battery power inherently means a time-line by which the ability to power the device will degrade. The computational level may be adjusted, leading to prolonged battery life and also to regulation of how often the device will transmit over the air. Battery level can be reported to the server in number of hours of operation still remaining.

Processing Power Available: another parameter that may be added to the attribute description is the CPU availability for processing. The amount of CPU available can also a factor in determining the complexity level of the compression scheme.

An adaptive power management scheme allows the server to first analyze the data that is received from the remote device, determine an improved or optimal compression scheme that will fit the data, instruct the remote device to accept the new compression scheme and parameters and command the remote device to send all the future data packets using the uploaded compression scheme.

Servers can have immense capacity for processing whereas the remote devices may have limited processing capacity. The remote devices mostly derive their power from a battery so that everything is designed around consuming as little power as possible. The remote device can neither compute for long, nor can it transmit for long as both impact the battery life.

Figure 6:
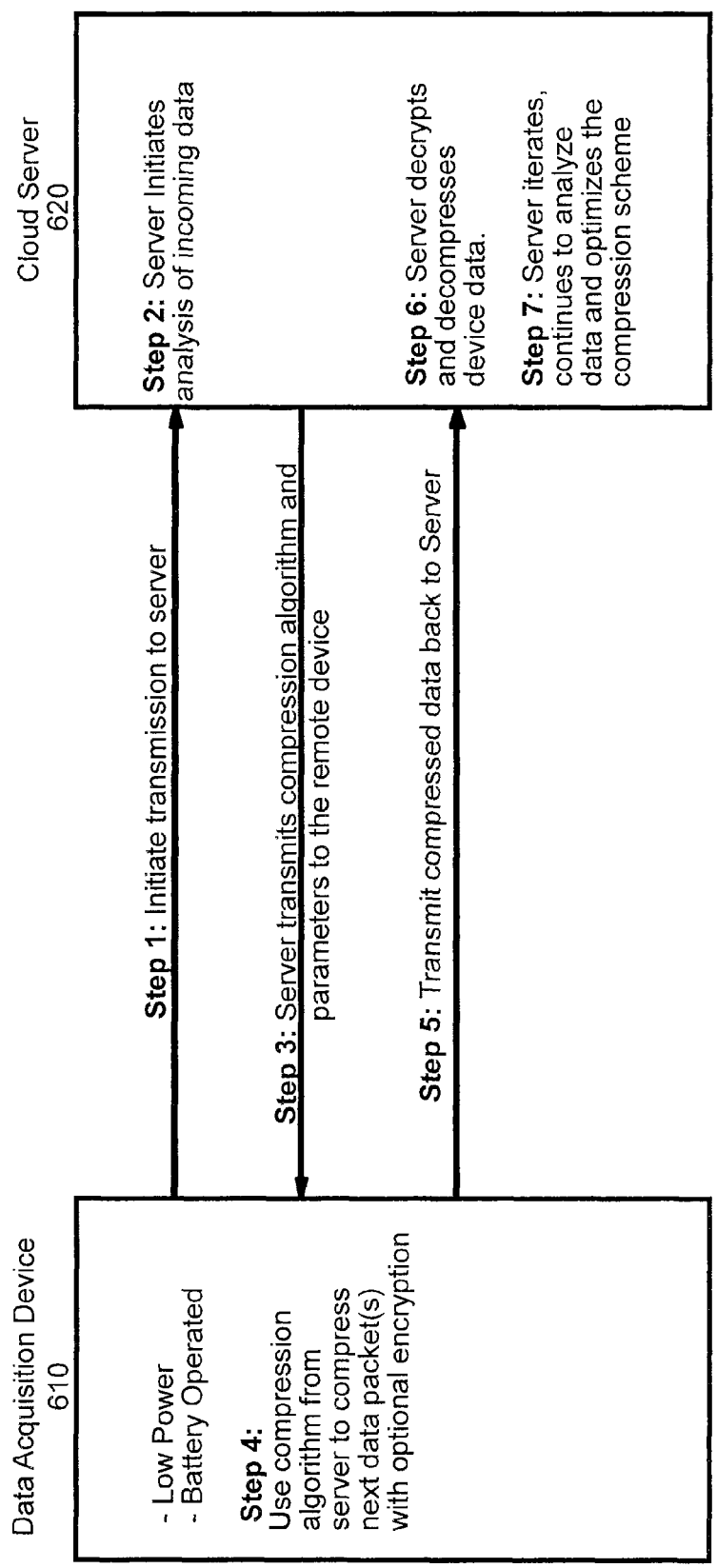
FIG. 6 is an example of a state transition sequence diagram.

FIG. 6 illustrates the sequence of how new compression parameters can be uploaded to the remote device (such as Data Acquisition Device 610). Step 1 is where the Remote Device commences transmission in default mode (see state transition 720 illustrated in FIG. 7). The transmission from the Remote Device may include one or more aspects of the Remote Device, such as one or more static aspects (such as the model type of the Remote Device, processor type, etc.) and/or one or more dynamic aspects (such as an indication of current battery level, current percentage of processor availability). The transmission from the remote device may be triggered in one of several ways. In a first way, the Remote Device may, on its own initiative, send the transmission. For example, the Remote Device at a predetermined time (such as power-up of the remote device) may initiate the transmission. In a second way, the Remote Device may, in response to receiving a communication from Cloud Server 620, send the transmission. For example, the Cloud Server 620 may send a request to the Remote Device asking for the one or more aspects of the Remote Device.

Step 2 includes the server initiating analysis of the incoming data from the Remote Device. In particular, in response to the data sent from the Remote Device, the server (such as Cloud Server 620) may analyze the data (see state transition 730). An example of a Cloud Server is disclosed in U.S. application Ser. No. 13/272,954, entitled "Network Based Machine-to-Machine System for Monitoring", hereby incorporated by reference herein in its entirety. In particular, following the analysis as illustrated in the state transition 730, the server can initiate a request for the remote device attributes (see state transition 711).

Based on the analysis, at Step 3, the server may transmit a compression algorithm and parameters (such as the compression algorithm/parameters or an indication of the compression algorithm/parameters already resident in Remote Device).

At Step 4, the Remote Device may process the transmission from the server to select a compression algorithm in order to compress the data packet(s).

At Step 5, the Remote Device transmits the compressed packets to the Server. In response, at Step 6, the server decompresses the compressed packets. At Step 7, the server iteratively analyzes the data received from the Remote Device in order to improve or optimize the compression scheme.

Figure 7:
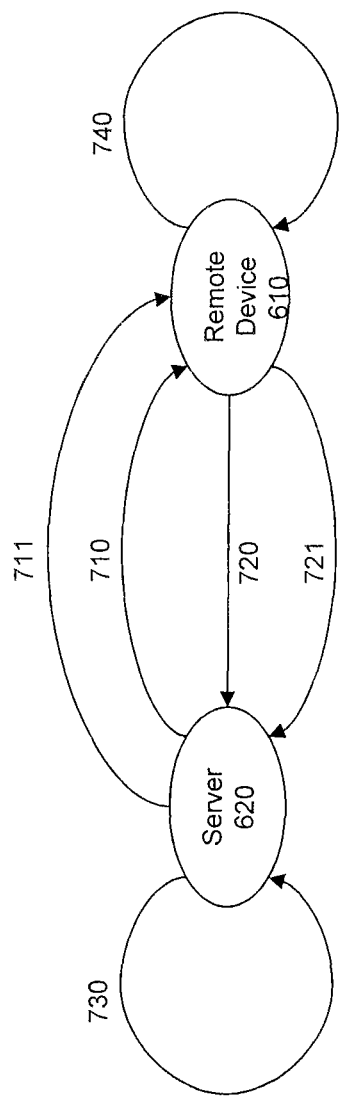
FIG. 7 is an example of a compression state machine.

FIG. 7 is an example of a compression state machine. State 710 (Request Device Attributes from Server) seeks to inquire from the remote device its attributes, which are used for subsequent analysis. This state transition happens during initiation of data transmission between the server and the remote device. For example, the server may request preloaded compression types or it can access the device attributes to provide its capabilities.

State 711 (Compression Command from Server) is the initial transition state where the server sends a command to set a new compression type for the remote device. This state transition may also be initiated by the server anytime it wants to change any aspect of the compression, such as the compression type, in the remote device. The server can also initiate this transition if it continues to receive data in raw packets from the remote device and wants future transmission to be performed with the default compression scheme (e.g. fixed Huffman table, Algorithm attribute 1). In a specific situation, the remote device may also set a flag to override the compression type requested by the server. This decision is reached by the remote device when the remote device determines that the compressed data packets (compressed based on the compression scheme commanded by the server) are greater than the raw packet length. In this way, the remote device has the intelligence to analyze and potentially reject a command from the server for a particular compression scheme.

This state transition may have an internal flag set indicating a compression command execution has been requested. The server, upon receiving the data with the new compression scheme, may then reset compression command flag which was set when it initiated the command state transition.

State 720 (Normal Transmission from remote device) is a communication from the remote device to the server. The remote device sends data packets from the remote device back to the server. In the communication, the remote device can indicate the compression type used, such as the flag on byte position 95 indicative the compression type being used, as discussed in more detail below. This can serve as an acknowledgement to the Server as the new compression type used by the remote device. Optionally, an 'Ack Mode" can also be initiated.

State 721 (Attribute Response) is a transition that occurs to respond to a specific command from the Server to seek the attributes and capabilities of the system.

State 730 (Trigger State Server) is a trigger state transition that can runs continuously (or at predetermined times) as a monitoring thread. This thread comprises the Server monitoring the packets received from the Remote Device. In particular, the Server may monitor the compression efficiency of the data packets against a bench mark and can initiate a transition to state 710 with a new compression type if certain predetermined conditions occur, such "n" consecutive packets that the bench mark is not met. In the event that this thread observes one or several packets that contain the compression override flag from the Remote Device, then the thread can initiate the state transition 710 with a new compression type. This state has knowledge of all of the Compression Types existing or available in the Server.

State 740 (Trigger State Remote device) is a trigger state transition that runs continuously as a monitoring thread in the Remote Device. This thread is monitoring the compression efficiency on the Remote Device. It keeps a tab on how efficiently the packets are compressed against the size of raw data packets. This thread can determine to transmit raw packets and set the compression type in byte offset 95 to indicate raw packet transmission (thereby overriding the compression command as indicated by the Server). This state records the current compression type set in the remote device. In this way, one of (or both of) the Server and the Remote Device may monitor the compression efficiency.

Figure 8A:
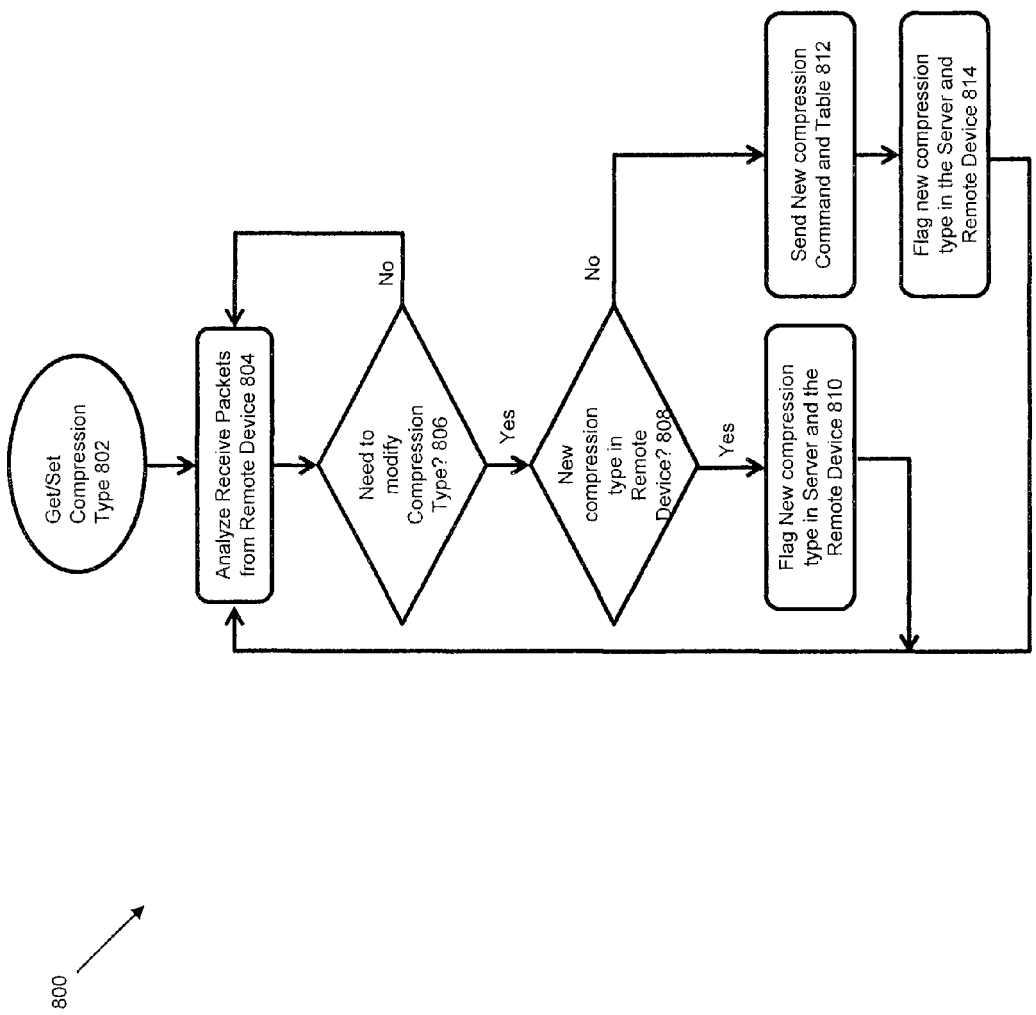
FIG. 8a is a flow chart of the adaptive compression process.

FIG. 8a is a flow chart 800 of the adaptive compression process.

Flow chart 800 represents an adaptive thread may run continuously at the Server end examining the incoming packets of data. It includes the first routine at 802 of getting and setting the compression type in the Remote Device as well as the Server. Typically, Remote Devices will have a set of compression types pre-installed and a default compression type set.

Figure 8B:
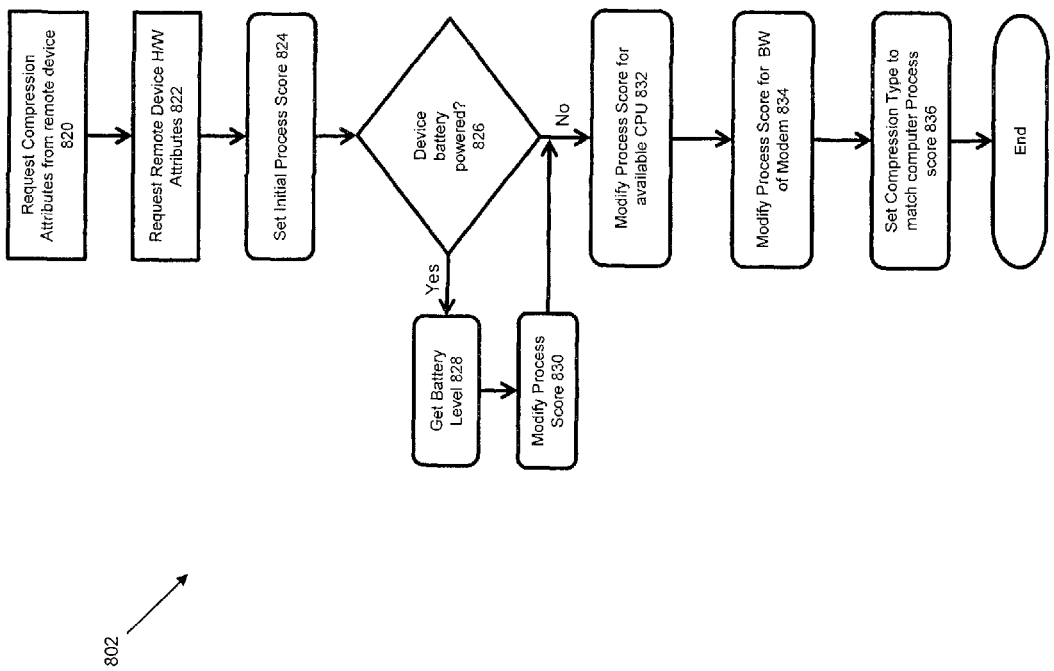

FIG. 8b is a flow chart of the get/set compression type 802 within the adaptive compression process of FIG. 8a.

The get/set compression type routine includes block 820, which requests one, some, or all of the compression types present in the Remote Device. At 822, the Server requests the Remote Device to provide one, some, or all of the remote device attributes. Examples of the remote device attributes include, but are not limited to, battery level, performance level, CPU availability. Using the attributes received, at 824, the Server sets the initial process score. The cumulative process score at the end of the routine will determine which compression type is most suitable for transmission from the Remote Device.

At 826, the Server checks if the Remote Device is battery powered. If the remote device is battery powered, at 828, the Server will obtain the battery level and at 830 will update the process score. The process score is updated because it will direct which compression types will be used if the Remote Device is battery powered.

At 832, the Server analyzes another attribute, CPU availability, in the Remote device. This factor also can modify the process score. At 834, the Server modifies the process score to match the Bandwidth of the communication medium. The Modem can transmit in either one of the spectrums, 2G, 3G, 4G and LTE. Each has a different Bandwidth connotation. Once all the attributes that influence the process score are computed, the Server at 836 decides which compression type will be used by the remote device.

Once the Server determines the compression type at 802, the compression type is set both in the Server and the Remote Device. In this way, 802 is the initialization process, which is the first step in the adaptive compression system setup.

Block 804 commences the adaptive compression thread operation. Block 804 performs the analysis of the packets. The Server may decide the optimal level at which time to analyze the packets. For example, the Server may perform the packet analysis every "n number" of packets. Alternatively, the Server may perform the packet analysis after a predetermined amount of time has elapsed.

The results of the analysis of the packets are passed to 806, which checks if the compression type needs to be modified. If no action is needed the thread returns to 804 to analyze the next set of packets. If the Server determines that the compression type needs to be modified, the Server may select a new compression type. The Server may have a plurality of compression types available. Examples of different compression types are discussed above. The Server may analyze one, some, or all of the plurality of compression types available to select a new compression type. The Server may select the new compression type if it improves the compression scheme over the previous compression type selected. If a new compression type is needed, at 808, the Server checks if the new compression type exists in the Remote Device. If the new compression type exists then at 810, the Server sets the new compression type sends a communication to the Remote Device of the new compression type. Thereafter, the flow chart 800 returns to 804 for further packet analysis.

If the desired new compression type does not exist in the Remote Device and if the Remote Device is capable of accepting the new compression type, then at 812, the Server sends the new compression table to the Remote Device and at 814, the Server updates the new compression type in the system.

Figure 4:
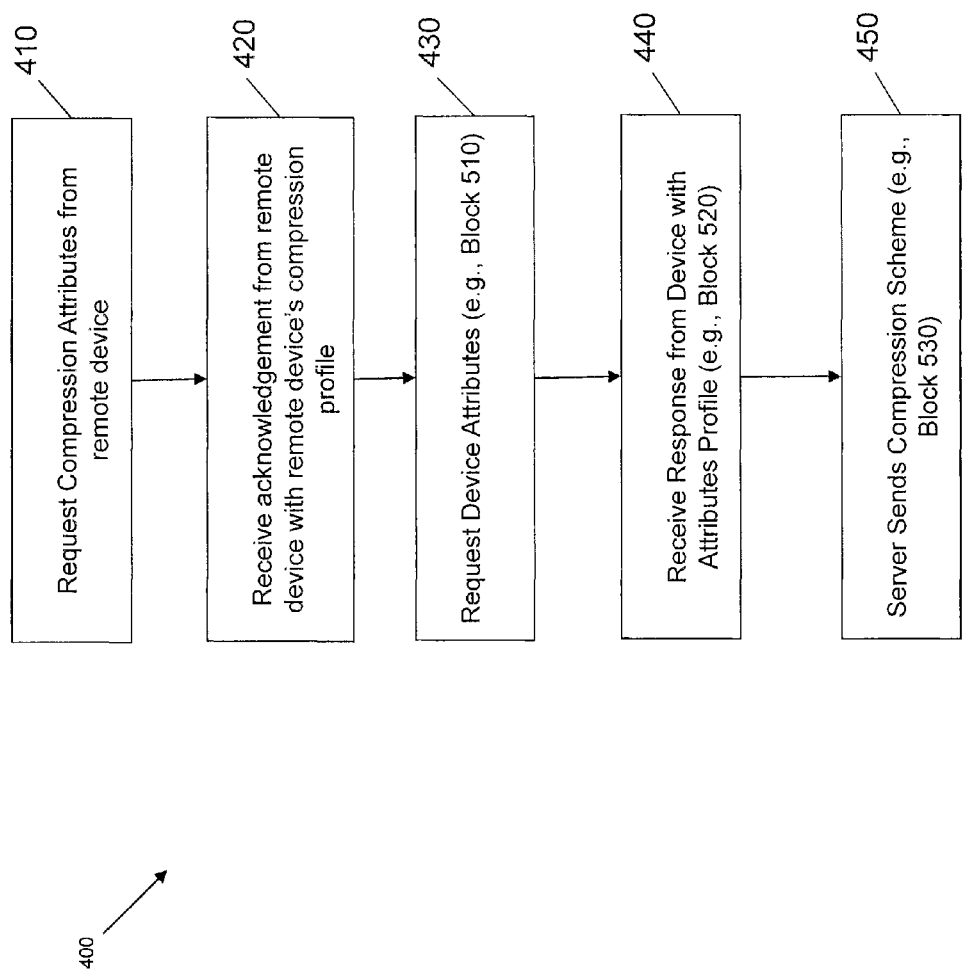
FIG. 4 is an example of a flow diagram of a compression command sequence.
Figure 9:
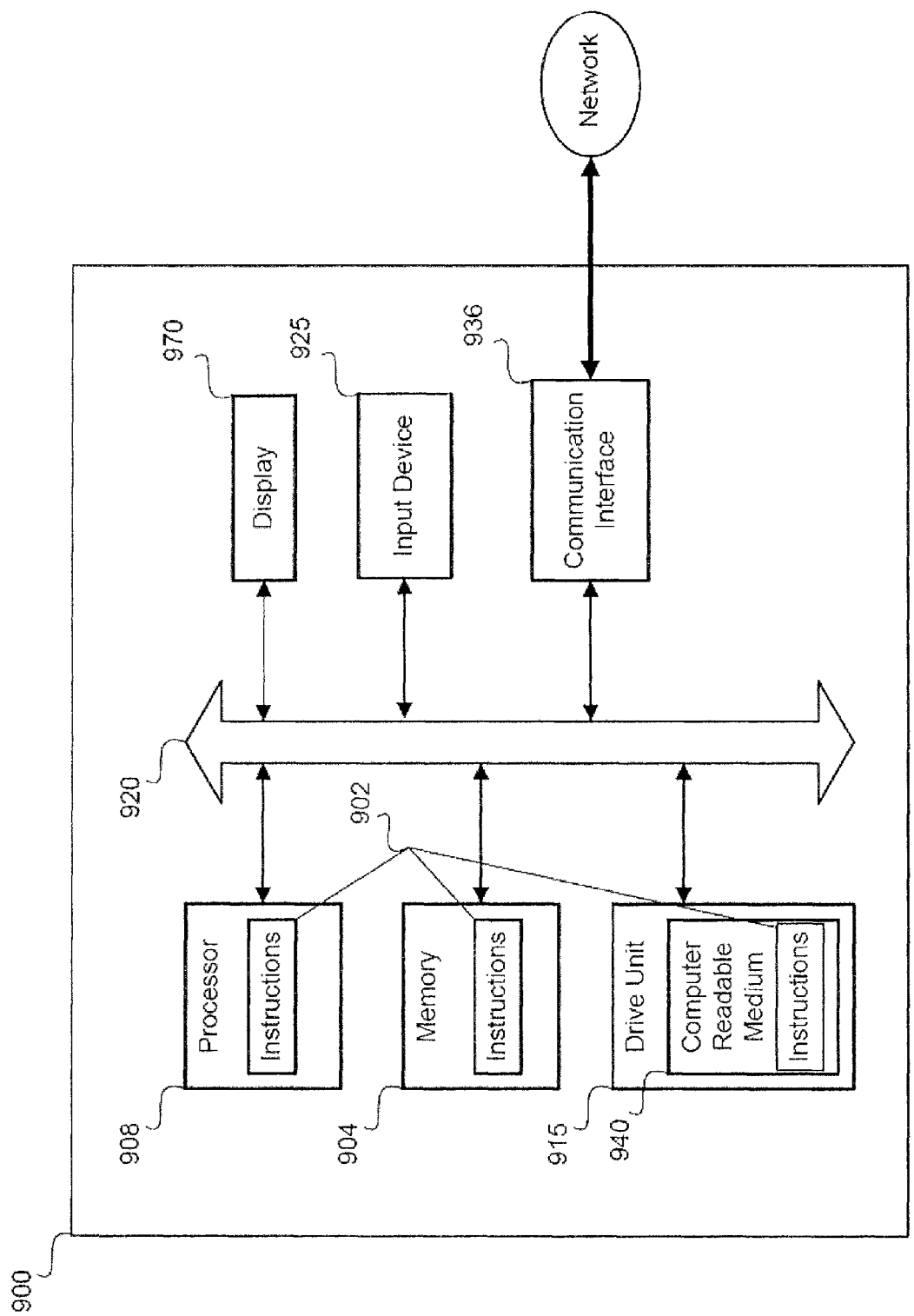
FIG. 9 is a general computer system, programmable to be a specific computer system, which may represent any of the computing devices referenced herein.

FIG. 9 illustrates a general computer system 900, programmable to be a specific computer system, which may represent any part of system 100, such as Web Monitoring System 120, Adaptive Compression System 121, Remote Device 130, User I/F 110, Web Monitoring System 220, Adaptive Compression System 221, Remote Device 240, User I/F 200, or any other computing devices referenced herein or that may be executed within system 100. FIG. 6 illustrates a state transition sequence diagram, FIG. 7 illustrates a compression state machine, and FIGS. 4 and 8a-8b illustrate flow diagrams, all of which may be implemented on the general computer system 900 as illustrated in FIG. 9. The different functionalities of the Adaptive Compression System 121 and the Adaptive Compression System 221 may be implemented on the general computer system 900 as illustrated in FIG. 9. The computer system 900 may include an ordered listing of a set of instructions 902 that may be executed to cause the computer system 900 to perform any one or more of the methods or computer-based functions disclosed herein. The computer system 900 may operate as a stand-alone device or may be connected, e.g., using one or more networks as illustrated in FIGS. 1 and 2, to other computer systems or peripheral devices.

In a networked deployment, the computer system 900 may operate in the capacity of a server or as a client-user computer in a server-client user network environment, or as a peer computer system in a peer-to-peer (or distributed) network environment. The computer system 900 may also be implemented as or incorporated into various devices, such as a personal computer or a mobile computing device capable of executing a set of instructions 902 that specify actions to be taken by that machine, including and not limited to, accessing the Internet or Web through any form of browser. Further, each of the systems described may include any collection of sub-systems that individually or jointly execute a set, or multiple sets, of instructions to perform one or more computer functions.

The computer system 900 may include a memory 904 on a bus 920 for communicating information. Code operable to cause the computer system to perform any of the acts or operations described herein may be stored in the memory 904. The memory 904 may be a random-access memory, read-only memory, programmable memory, hard disk drive or any other type of volatile or non-volatile memory or storage device.

The computer system 900 may include a processor 908, such as a central processing unit (CPU) and/or a graphics processing unit (GPU). The processor 908 may include one or more general processors, digital signal processors, application specific integrated circuits, field programmable gate arrays, digital circuits, optical circuits, analog circuits, combinations thereof, or other now known or later-developed devices for analyzing and processing data. The processor 908 may implement the set of instructions 902 or other software program, such as manually-programmed or computer-generated code for implementing logical functions. The logical function or any system element described may, among other functions, process and/or convert an analog data source such as an analog electrical, audio, or video signal, or a combination thereof, to a digital data source for audio-visual purposes or other digital processing purposes such as for compatibility for computer processing.

The computer system 900 may also include a disk or optical drive unit 915. The disk drive unit 915 may include a computer-readable medium 940 in which one or more sets of instructions 902, e.g., software, can be embedded. Further, the instructions 902 may perform one or more of the operations as described herein. The instructions 902 may reside completely, or at least partially, within the memory 904 and/or within the processor 908 during execution by the computer system 900. Accordingly, the databases 140 and 220 described above in FIGS. 1-2 may be stored in the memory 904 and/or the disk unit 915.

The memory 904 and the processor 908 also may include computer-readable media as discussed above. A "computer-readable medium," "computer-readable storage medium," "machine readable medium," "propagated-signal medium," and/or "signal-bearing medium" may include any device that includes, stores, communicates, propagates, or transports software for use by or in connection with an instruction executable system, apparatus, or device. The machine-readable medium may selectively be, but not limited to, an electronic, magnetic, optical, electromagnetic, infrared, or semiconductor system, apparatus, device, or propagation medium.

Additionally, the computer system 900 may include an input device 925, such as a keyboard or mouse, configured for a user to interact with any of the components of system 900. It may further include a display 970, such as a liquid crystal display (LCD), a cathode ray tube (CRT), or any other display suitable for conveying information. The display 970 may act as an interface for the user to see the functioning of the processor 908, or specifically as an interface with the software stored in the memory 904 or the drive unit 915.

The computer system 900 may include a communication interface 936 that enables communications via the communications networks illustrated in FIGS. 1 and 2. The communications networks illustrated in FIGS. 1 and 2 may include wired networks, wireless networks, or combinations thereof.

described herein is suited. A typical combination of hardware and software may be a general-purpose computer system with a computer program that, when being loaded and executed, controls the computer system such that it carries out the methods described herein. Such a programmed computer may be considered a special-purpose computer.

The method and system may also be embedded in a computer program product, which includes all the features enabling the implementation of the operations described herein and which, when loaded in a computer system, is able to carry out these operations. Computer program in the present context means any expression, in any language, code or notation, of a set of instructions intended to cause a system having an information processing capability to perform a particular function, either directly or after either or both of the following: a) conversion to another language, code or notation; b) reproduction in a different material form.

The table below provides an example of a Remote Device data packet:

| Parameter | Byte Offset | Number of Bytes | Description |
| --- | --- | --- | --- |
| DEVICE_ID | 0 | 22 | Starts with a Blank space (1 Byte, value 0x20) followed by Modem ID (20 Bytes) and ends with a Blank space (1 Byte, value 0x20). If Modem ID is less than 20 Bytes, same will be prefixed with blank spaces followed by MODEM ID |
| ONE_SPACE | 22 | 1 | Blank space, value 0x20 |
| PACKET_HEADER | 23 | 8 | Please check the unique ID |
| ONE_SPACE | 31 | 1 | Blank space, value 0x20 |
| PACKET_NUMBER | 32 | 8 | Packet serial number range: "00000000" to "FFFFFFFF" For every STPF packet transmitted, the packet number is incremented. |
| ONE_SPACE | 40 | 1 | Blank space, value 0x20 |
| DATE | 41 | 8 | Copies latest GPS date: "00DDMMYY" (DD = GPS day, MM = GPS month, YY = GPS year) |
| ONE_SPACE | 49 | 1 | Blank space, value 0x20 |
| TIME | 50 | 8 | GPS time: "00HHMMSS" (HH = GPS hour, MM = GPS minute, SS = GPS second) |
| ONE_SPACE | 58 | 1 | Blank space, value 0x20 |
| GPS_LAT_DIR | 59 | 8 | GPS latitude (with cardinal info): GPS latitude times 10000 (if 'S' times −1). For example: If GPS reports 4807.0380, N (48 deg 07.0380' N), value will be stored as: 48070380 = "02DD7EEC" If GPS reports 4807.0380, S (48 deg 07.0380' S), value will be stored as: −48070380 = "FD228114" Combinations can be, DMM.MMMM DDMM.MMMM To be referenced from right to left starting from .MMMM then MM rest digits are DD |

The communication interface 936 network may enable communications via any number of communication standards, such as 802.11, 802.17, 802.20, WiMax, 802.15.4, cellular telephone standards, or other communication standards. Simply because one of these standards is listed does not mean any one is preferred as any number of these standards may never actually be adopted in a commercial product.

Accordingly, the method and system may be realized in hardware, software, or a combination of hardware and software. The method and system may be realized in a centralized fashion in at least one computer system or in a distributed fashion where different elements are spread across several interconnected computer systems. Any kind of computer system or other apparatus adapted for carrying out the methods The above-disclosed subject matter is to be considered illustrative, and not restrictive, and the appended claims are intended to cover all such modifications, enhancements, and other embodiments, which fall within the true spirit and scope of the present disclosure. Thus, to the maximum extent allowed by law, the scope of the present embodiments are to be determined by the broadest permissible interpretation of the following claims and their equivalents, and shall not be restricted or limited by the foregoing detailed description. While various embodiments have been described, it will be apparent to those of ordinary skill in the art that many more embodiments and implementations are possible within the scope of the above detailed description. Accordingly, the embodiments are not to be restricted except in light of the attached claims and their equivalents.

We claim:

1. A server configured to select an adaptive compression scheme for one or more remote mobile computing devices, the server comprising:
   a memory; and
   a processor in communication with the memory, the processor configured to:
   receive one or more attributes of a remote mobile device;
   select an inter-packet compression scheme based on the one or more attributes, the inter-packet compression scheme configured to perform inter-packet compression for a first field of multiple packets communicated with the remote mobile device;
   select an intra-packet compression scheme configured to perform intra-packet compression on a second field of a packet communicated with the remote mobile device, wherein the first field is different from the second field;
   send an indication of the selected inter-packet compression scheme and the selected intra-packet compression scheme or the selected inter-packet compression scheme and the selected intra-packet compression scheme to the remote mobile device;
   receive, from the remote mobile device, a communication, the communication being based on comparison by the remote mobile device of efficiency of transmission of data with at least one of the selected inter-packet compression scheme and the selected intra-packet compression scheme versus another transition scheme, and indicative of selection by the remote mobile device of the another transmission scheme, thereby rejecting the indication of the at least one of selected inter-packet compression scheme and the selected intra-packet compression scheme or the at least one of the selected inter-packet compression scheme and the selected intra-packet compression scheme; and
   in response to receiving the communication, select the another transmission scheme.

2. The server of claim 1, wherein the one or more attributes of the remote mobile device comprise one or more dynamic attributes of the remote mobile device.

3. The server of claim 2, wherein the one or more dynamic attributes comprise an indication of current battery level of the remote mobile device.

4. The server of claim 1, wherein the one or more attributes of the remote mobile device comprise one or more static attributes of the remote mobile device.

5. The server of claim 4, wherein the one or more static attributes comprise an indication of a data profile, the data profile indicative of correlation of data transmitted between the remote mobile device and the server; and wherein the processor is configured to select the compression scheme based on the data profile sent from the remote mobile device.

6. The server of claim 1, wherein the processor is configured to iteratively select the inter-packet compression scheme.

7. The server of claim 6, wherein the processor is configured to iteratively select the inter-packet compression scheme by:
   analyzing packets received from the remote mobile device;
   determining whether to change the inter-packet compression scheme based on the analysis of the packets; and
   if it is determined to change the inter-packet compression scheme, analyzing multiple inter-packet compression types; and
   selecting one of the multiple inter-packet compression types based on the analysis of the multiple compression types.

8. A method for selecting an adaptive compression scheme for one or more remote computing devices, the method comprising:
   receiving, by a server, one or more attributes of a remote mobile device;
   selecting, by the server, an inter-packet compression scheme based on the one or more attributes, the inter-packet compression scheme configured to perform inter-packet compression for a first field of multiple packets communicated with the remote mobile device;
   selecting, by the server, an intra-packet compression scheme configured to perform intra-packet compression on a second field of a packet communicated with the remote mobile device, wherein the first field is different from the second field;
   sending an indication of the selected inter-packet compression scheme and the selected intra-packet compression scheme or the selected inter-packet compression scheme and the selected intra-packet compression scheme to the remote mobile device;
   receiving, by the server from the remote mobile device, a communication, the communication being based on comparison by the remote mobile device of efficiency of transmission of data with at least one of the selected inter-packet compression scheme and the selected intra-packet compression scheme versus another transition scheme, and indicative of selection by the remote mobile device of the another transmission scheme, thereby rejecting the indication of the at least one of selected inter-packet compression scheme and the selected intra-packet compression scheme or the at least one of the selected inter-packet compression scheme and the selected intra-packet compression scheme; and
   in response to receiving the communication, selecting, by the server, the another transmission scheme.

9. The method of claim 8, wherein the one or more attributes of the remote mobile device comprise one or more dynamic attributes of the remote mobile device.

10. The method of claim 9, wherein the one or more dynamic attributes comprise an indication of current battery level of the remote mobile device.

11. The method of claim 9, wherein the one or more attributes of the remote mobile device comprise one or more static attributes of the remote mobile device.

12. The method of claim 11, wherein the one or more static attributes comprise an indication of a data profile, the data profile indicative of correlation of data transmitted between the remote mobile device and the server; and
   wherein selecting the compression scheme is based on the data profile sent from the remote mobile device.

13. The method of claim 8, wherein selecting the inter-packet compression scheme based on the one or more attributes comprises iteratively selecting the inter-packet compression scheme.

14. The method of claim 13, wherein iteratively selecting the inter-packet compression scheme comprises:
   analyzing packets received from the remote mobile device;
   determining whether to change the inter-packet compression scheme based on the analysis of the packets; and
   if it is determined to change the inter-packet compression scheme, analyzing multiple inter-packet compression types; and
   selecting one of the inter-packet multiple compression types based on the analysis of the multiple compression types.

15. A server configured to select an adaptive compression scheme for one or more remote mobile computing devices, the server comprising:
- a memory; and
- a processor in communication with the memory, the processor configured to:
  - select an inter-packet compression scheme, the inter-packet compression scheme configured to perform inter-packet compression for a first field of multiple packets communicated with a remote mobile device;
  - select an intra-packet compression scheme configured to perform intra-packet compression on a second field of a packet communicated with the remote mobile device, wherein the first field is different from the second field;
  - send, to the remote mobile device, the selected inter-packet compression scheme and the selected intra-packet compression scheme or an indication of the selected inter-packet compression scheme and an indication of the selected intra-packet compression scheme; and
  - receive a communication from the remote mobile device, the communication indicative of a selection of another transmission scheme or a rejection of the selected one or both of the inter-packet compression scheme or the intra-packet compression scheme.

16. The server of claim 15, wherein the processor is further configured to:
dynamically analyze data in the multiple packets in order to select the compression scheme.

17. The server of claim 15, wherein the multiple packets include different fields in each of the multiple packets; and
wherein the processor is configured to select different compression schemes for the different fields in order to perform the inter-packet compression amongst the different fields in the multiple packets sent from the remote mobile device.

18. The server of claim 15, wherein the communication indicative of a selection of another transmission scheme or a rejection of a compression the selected one or both of the inter-packet compression scheme or the intra-packet compression scheme is based on an analysis of compressed data packets and raw data packets.

19. The server of claim 1, wherein the another transition scheme comprises transmitting raw data; and
wherein, in response to receiving the communication, the processor is configured to select to transmit the raw data.

20. The method of claim 8, wherein the another transition scheme comprises transmitting raw data; and
wherein, in response to receiving the communication, transmitting raw data is selected.

* * * * *